United States Patent
Tian et al.

(10) Patent No.: US 11,802,075 B2
(45) Date of Patent: Oct. 31, 2023

(54) LITHIUM AND TELLURIUM-SILICATE BINARY GLASS-OXIDE-COMPLEX SYSTEM AND CONDUCTIVE PASTE CONTAINING SUCH COMPLEX SYSTEM

(71) Applicant: Jiangsu Riyu Photovoltaic New Material Technology Co. Ltd, Wuxi (CN)

(72) Inventors: Rui Tian, Wuxi (CN); Song Xu, Wuxi (CN)

(73) Assignee: JIANGSU RIYU PHOTOVOLTAIC NEW MATERIAL TECHNOLOGY, Wuxi (CN)

( * ) Notice: Subject to any disclaimer, the term of this patent is extended or adjusted under 35 U.S.C. 154(b) by 0 days.

(21) Appl. No.: 17/585,682

(22) Filed: Jan. 27, 2022

(65) Prior Publication Data
US 2022/0144688 A1    May 12, 2022

(30) Foreign Application Priority Data
Dec. 29, 2021    (CN) .......................... 202111635541.8

(51) Int. Cl.
C03C 8/10    (2006.01)
H01L 31/02    (2006.01)
H01L 31/0224    (2006.01)

(52) U.S. Cl.
CPC ........ C03C 8/10 (2013.01); H01L 31/022425 (2013.01)

(58) Field of Classification Search
CPC .... C03C 8/22; C03C 3/07; C03C 4/14; C03C 3/074; C03C 8/10; C03C 8/18; C03C 2205/00; C03C 2204/00; C03C 3/122; C03C 8/12; C03C 8/16; C03C 3/062; H01L 31/022425; H01B 1/16; H01B 1/22; Y02E 10/50
See application file for complete search history.

(56) References Cited

U.S. PATENT DOCUMENTS

| | | | | |
|---|---|---|---|---|
| 11,518,892 | B2* | 12/2022 | Jung | .................. H01B 1/22 |
| 2019/0305150 | A1* | 10/2019 | Liu | .................. B22F 1/10 |
| 2020/0048140 | A1* | 2/2020 | Hsu | .................. C03C 8/22 |

FOREIGN PATENT DOCUMENTS

| | | |
|---|---|---|
| CN | 104756197 A | 7/2015 |
| CN | 106098138 A | 11/2016 |
| CN | 110255888 A | 9/2019 |
| CN | 111499208 A | 8/2020 |
| CN | 111548021 A | 8/2020 |
| CN | 111599506 A | 8/2020 |
| CN | 111902881 A | 11/2020 |
| CN | 112830682 A | 5/2021 |
| CN | 113443833 A | 9/2021 |
| KR | 101400133 B1 | 5/2014 |

* cited by examiner

*Primary Examiner* — Haidung D Nguyen
(74) *Attorney, Agent, or Firm* — IPRO, PLLC

(57) ABSTRACT

The present disclosure discloses a lithium and tellurium-silicate binary glass-oxide-complex system and a conductive paste containing the complex system, and belongs to the technical field of solar cells. The present disclosure uses a "functional modularity" strategy in the formula design of a glass-oxide-complex system (GOC). Alkali metal ions with high migration and reactivity are separated from a glass body with high fluidity, thus a binary complex system is constructed, that is, a lithium-containing glass-oxide-complex (Li-GOC) with high activity and a tellurium-silica-containing glass-oxide-complex (Si—Te-GOC) with high fluidity. Through the modularized formula strategy, active ingredients can be better controlled, so as to obtain more balanced contact and open circuit voltage and improve the photoelectric conversion efficiency of a solar cell.

13 Claims, 1 Drawing Sheet

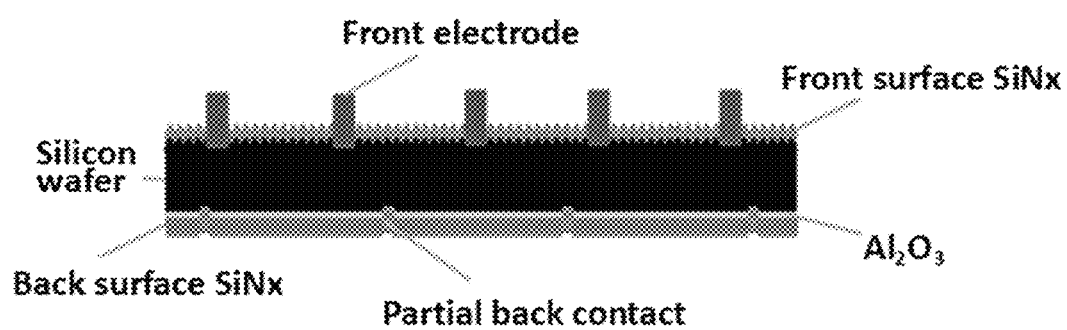

LITHIUM AND TELLURIUM-SILICATE BINARY GLASS-OXIDE-COMPLEX SYSTEM AND CONDUCTIVE PASTE CONTAINING SUCH COMPLEX SYSTEM

TECHNICAL FIELD

The present disclosure belongs to the technical field of solar cells and particularly relates to a lithium and tellurium-silicate binary glass-oxide-complex system and a conductive paste containing the complex system.

BACKGROUND

A solar cell is a device capable of converting light energy into electrical energy by using a photovoltaic effect. Solar energy is a green energy source that has attracted much attention since it is sustainable and only produces pollution-free by-products. Therefore, a large number of industrial and academic researchers are now devoted to developing a solar cell with enhanced efficiency and continuously reduced material and manufacturing costs.

When light irradiates the solar cell, a part of the incident light is reflected by a surface and the rest of the light is transmitted into the solar cell. The transmitted light/photons are absorbed by the solar cell. The solar cell is usually made of a semiconductor material, such as silicon. The absorbed photon energy excites electrons from atoms of the semiconductor material and electron-hole pairs are generated. The electron-hole pairs are separated by a P-n junction and collected by a metallization electrode applied on the surface of the solar cell.

A typical metallization paste contains metal particles, glass powder and an organic medium. During sintering, glass particles in a composition etch through an anti-reflective coating, which helps to form the contact between the metal and n+ type silicon. The glass must not be too active to cause damage to the P-n junction after the sintering. Therefore, a design objective of the paste is to reduce the contact resistance (low Rhoc), while keeping the p-n junction intact (low Jmet and high Voc), thereby improving photovoltaic conversion efficiency of the cell.

A contact mechanism of the conductive paste on a silicon wafer reveals that on a silver electrode-interface glass layer-silicon surface, during a high-temperature sintering process of alkali metal ions and other metal ions, migration in a contact area will form a complex center and affect minority carrier lifetime of the p/n junction of the solar cell and the open circuit voltage of the cell. Moreover, these highly active ions will also affect a passivation layer in the contact area and even migrate to an area adjacent to metallization. In a popular PERC-SE process recent years, the use of laser enables a metallic area to be more sensitive to the impact brought by the metallic paste, such that controlling reactivity of the metallic paste, balancing the excellent metallization contact and reducing the negative impact of migration of active metal ions more less are a challenge faced by the formula design of a glass-oxide-complex system in the metallic paste.

SUMMARY

In order to solve the above-mentioned problems, the present disclosure uses a "functional modularity" strategy in the formula design of a glass-oxide-complex system (GOC). Alkali metal ions with high migration and reactivity are separated from a glass body with high fluidity, thus a binary complex system is constructed, that is, a lithium-containing glass-oxide-complex (Li-GOC) with high activity and a tellurium-silicate-containing glass-oxide-complex (Si—Te-GOC) with high fluidity. Through the modularized formula strategy, active ingredients can be better controlled, so as to obtain more balanced contact and open circuit voltage and improve the photoelectric conversion efficiency of a cell.

The binary complex formula of the present disclosure enables an overall formula of a paste to be adjusted according to a diffusion square resistance, a printing pattern and a sintering condition of a silicon wafer of a customer. To solve the foregoing technical problems, the present disclosure is implemented by using the following technical solutions.

The first objective of the present disclosure is to provide a lithium and tellurium-silicate binary glass-oxide-complex system for a solar cell conductive paste, which is prepared by mixing a lithium-containing glass-oxide-complex (Li-GOC) and a tellurium-silicate-containing glass-oxide-complex (Si—Te-GOC). The Li-GOC is obtained by mixing and fusing $Li_2O$, $Bi_2O_3$, PbO, and a metal oxide M1 to form a glass and oxide frit, and then performing quenching and grinding; and the Si—Te-GOC is obtained by mixing and fusing $SiO_2$, $TeO_2$, and a metal oxide M2 to form a glass and oxide frit, and then performing quenching and grinding.

The metal oxide M1 is at least one oxide of Na, K, Mg, Ca, Sr, Ba, Zn, P, B, Ti, Sb and Ge; and the metal oxide M2 is at least one oxide of Zn, P, B, Ag, Al, Ti, W, V, Cr, Mn, Co, Ni, Cu, Nb, Ta, Th, Ge, Mo, La, Sb, Bi and Ce.

In one embodiment of the present disclosure, the lithium and tellurium-silicate binary glass-oxide-complex system is composed of two GOCs separated from each other: Li-GOC and Si—Te-GOC; the Li-GOC accounts for 0.1%-50% by mass of the lithium and tellurium-silicate binary glass-oxide-complex system, and the Si—Te-GOC accounts for 20%-90% by mass of the lithium and tellurium-silicate binary glass-oxide-complex system.

In one embodiment of the present disclosure, the Li-GOC and the Si—Te-GOC are at a mass ratio of 1:(1-9) in the lithium and tellurium-silicate binary glass-oxide-complex system; more preferably a mass ratio of 1:(1-2).

In one embodiment of the present disclosure, the Li-GOC has a formula as follows:

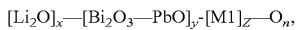

where x, y and z are mass fractions of the corresponding oxides in the Li-GOC; x+y+z=100%, 2%<x<50%, 5%<y<85% and 1%<z<10%; and the value of n is used to balance positive and negative charges of the entire formula.

In one embodiment of the present disclosure, the Si—Te-GOC contains tellurium-silica-containing glass or a crystalline oxide and has a formula as follows:

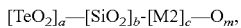

where a, b and c are mass fractions of the corresponding oxides in the Si—Te-GOC; a+b+c=100%, 10%<a<90%, 10%<b<90% and 1%<c<10%; and the value of m is used to balance positive and negative charges of the entire formula.

In one embodiment of the present disclosure, the Li-GOC does not contain tellurium and silica; and the Si—Te-GOC does not contain lithium.

In one embodiment of the present disclosure, the Li-GOC has a formula consisting of 15%-20% of $Li_2O$, 25%-65% of PbO, 10%-20% of $Bi_2O_3$, 0-6% of ZnO and 0.5%-3% of $B_2O_3$ according to the mass percentage of the Li-GOC.

In one embodiment of the present disclosure, the Si—Te-GOC has a formula consisting of 10%-20% of $SiO_2$, 70%-

80% of $TeO_2$, 2%-10% of $Bi_2O_3$, 0.5%-1.0% of $B_2O_3$ and 0.5%-2% of $Na_2O$ according to the mass percentage of the Si—Te-GOC.

In one embodiment of the present disclosure, a preparation process of the lithium and tellurium-silicate binary glass-oxide-complex system for a solar cell conductive paste includes the following steps:

step 1, manufacturing the lithium and tellurium-silicate binary glass-oxide-complex system (GOC): respectively preparing the Li-GOC and the Si—Te-GOC; and step 2, mixing the two GOCs of the Li-GOC and the Si—Te-GOC.

In one embodiment of the present disclosure, the GOC is prepared by fusing and quenching of a commonly used glass body or other inorganic solid-phase synthesis or non-high temperature wet chemical methods.

In the typical fusing and quenching method, an appropriate amount of raw materials (usually in a powder form) are mixed, a mixture is fused into molten glass at the temperature of 500-1300° C., and the molten glass forms a uniform fusant; the fusant is quenched (in water or by a cooling roll), and pulverized and sieved by a ball mill or a jet mill, and coarse powder is subjected to secondary grinding in a ball mill or a jet mill until fine powder is produced; and the glass powder can be ground to an average particle size (d50) of about 0.01-10 μm, preferably about 0.1-5 μm.

Or, the inorganic solid-phase synthesis is usually as follows: a fully mixed oxide raw material is placed in a crucible or a quartz tube and a solid-state synthesis reaction is conducted for 5-24 h in vacuum, under nitrogen protection or in air at appropriate high temperature to produce expected crystal complex oxide powder. The complex oxide powder can be ground to the average particle size (d50) of about 0.01-10 μm, preferably about 0.1-5 μm.

Or, the glass powder and the complex oxide GOC can also be prepared by a wet chemical method, including but not limited to a sol-gel method, precipitation, a hydrothermal/solvothermal method, and a pyrolysis method to prepare powder with an expected particle size.

In one embodiment of the present disclosure, the binary GOCs are premixed as follows:

In order to ensure that the lithium and tellurium-silicate binary glass-oxide-complex system (GOC) can be uniformly distributed in a paste and uniformly react with a surface of a silicon wafer, sufficient pre-mixing is necessary. In the practice of the present disclosure, according to the silicon wafer requirement of a customer, a lithium-containing glass-oxide-complex (Li-GOC) with high activity and a tellurium-silicate-containing glass-oxide-complex (Si—Te-GOC) with high fluidity at an appropriate proportion are selected and placed on a ball mill for sufficient pre-mixing. Uniform distribution of the GOCs is achieved and the particle size is simultaneously reduced to expected particle size distribution.

The second objective of the present disclosure is to provide a solar cell conductive paste including a lithium and tellurium-silicate binary glass-oxide-complex system. The conductive paste includes a conductive metal component, the lithium and tellurium-silicate binary glass-oxide-complex system and an organic carrier.

In one embodiment of the present disclosure, the conductive metal component includes silver, gold, platinum, palladium, copper, nickel and a combination thereof.

In one embodiment of the present disclosure, the conductive metal component accounts for 80%-99% by weight of the entire conductive paste.

In one embodiment of the present disclosure, the lithium and tellurium-silicate binary glass-oxide-complex system accounts for 0.2%-5% by weight of the entire conductive paste.

In one embodiment of the present disclosure, the organic carrier accounts for 2%-10% by weight of the entire conductive paste.

In one embodiment of the present disclosure, the organic carrier comprises an organic solvent and one or any combination of a binder, a surfactant and a thixotropic agent.

In one embodiment of the present disclosure, the organic solvent is selected from carbitol, terpineol, hexyl carbitol, 2,2,4-trimethyl-1,3-pentanediol monoisobutyrate, butyl carbitol, butyl carbitol acetate, dimethyl adipate glycol ether, and any combination thereof.

In one embodiment of the present disclosure, the binder is selected from ethyl cellulose, phenolic resin, polyacrylic acid, polyvinyl butyral, polyester resin, polycarbonate, polyethylene resin, polyurethane resin, a rosin derivative, and any combination thereof.

In one embodiment of the present disclosure, the surfactant is selected from polyoxyethylene, polyethylene glycol, benzotriazole, poly(ethylene glycol)acetic acid, lauric acid, oleic acid, capric acid, myristic acid, linoleic acid, stearic acid, palmitic acid, stearate, palmitate, and any combination thereof.

In one embodiment of the present disclosure, the solar cell conductive paste is prepared by the following steps:

step 1: preparing an organic carrier;

step 2: selecting the lithium and tellurium-silicate binary glass-oxide-complex system (GOC) pre-mixed in a specific ratio; and step 3: grinding the raw materials according to the above ratio by using a stirrer and a three-roll grinder to the solar cell conductive paste with a fine and uniform appearance and no large particles.

The third objective of the present disclosure is to provide a solar cell containing the solar cell metallic paste on a surface.

In one embodiment of the present disclosure, the solar cell metallic silver paste and aluminum paste are respectively printed on front and back sides of a silicon wafer in a predetermined pattern by screen printing, and drying is conducted; the printed silicon wafer is placed in an environment of 400-900° C. for sintering; and after the sintering is completed, the silicon wafer is cooled to room temperature to prepare the solar cell.

In one embodiment of the present disclosure, the sintering is conducted for 30-50 s.

Beneficial Effects:

The present disclosure uses the "functional modularity" strategy in the formula design of the glass-oxide-complex system (GOC). The alkali metal ions with high migration and reactivity are separated from the glass body with high fluidity, thus the binary complex system is constructed, that is, the lithium-containing glass-oxide-complex (Li-GOC) with high activity and the tellurium-silicate-containing glass-oxide-complex (Si—Te-GOC) with high fluidity. The two components complete their functions independently without affecting each other.

At present, most paste formulas are adjusted and optimized through a glass formula itself to achieve a balance between metallic contact and metal ion migration. However, since the glass formula needs to be adjusted as a whole or a combination of several glass formulas is used, the conductive paste has very low reactivity, thermal performance and flexibility of formula improvement. Due to separation of the lithium-containing glass-oxide-complex (Li-GOC) and the tellurium-silicate-containing glass-oxide-complex (Si—Te-GOC), in the conductive paste formula design, a ratio of the two GOCs can be adjusted freely according to needs of time. There is no need for finding a balance point between reactivity and fluidity in the same glass formula. This design greatly improves efficiency of formula adjustment. The overall paste formula optimized by the present disclosure can achieve the best photoelectric conversion efficiency on different silicon wafers.

BRIEF DESCRIPTION OF FIGURES

The FIGURE is a schematic structural diagram of a solar cell.

DETAILED DESCRIPTION

Example 1

Preparation of Glass-Oxide-Complex System (GOC):

Different Li-GOC1 and Si—Te-GOC1 were prepared with the components described in Table 1 and a single component Mix1 without separation was also prepared as a control. Samples were prepared in 200 g batches by mixing the oxide components in the amounts specified in Table 1. An oxide mixture was loaded into a platinum crucible with a volume of 0.5 L and the crucible was placed into a glass smelting furnace at 1300° C. for 30 min to obtain a glass and oxide frit; the frit was taken out and poured into a counter-roll cooler for quenching to obtain glass slags, and after the glass slags were ground in a 1 L planetary ball mill, the ground glass slags passed through a 325-mesh sieve to obtain Li-GOC1 powder, Si—Te-GOC1 powder and Mix1 powder respectively.

TABLE 1

Formulas of Li-GOC1, Si—Te-GOC1 and Mix1

| | | Mix1 | Li-GOC1 | Si—Te-GOC1 |
|---|---|---|---|---|
| Li-GOC | $Li_2O$ | 9.1% | 9.1% | / |
| | PbO | 27.3% | 27.3% | / |
| | $Bi_2O_3$ | / | 7.3% | / |
| | ZnO | 2.7% | 2.7% | / |
| | $B_2O_3$ | / | 0.45% | / |
| Si—Te-GOC | $SiO_2$ | 9.1% | / | 9.1% |
| | $TeO_2$ | 40.9% | / | 40.9% |
| | $Bi_2O_3$ | 9.1% | / | 1.8% |
| | $B_2O_3$ | 0.9% | / | 0.45% |
| | $Na_2O$ | 0.9% | / | 0.9% |

Preparation of Conductive Paste:

A list of components used in the following examples and comparative examples is as follows:

(1) conductive powder: spherical silver powder (AG-4-8, Dowa HighTech Co., Ltd.) with an average particle diameter (D50) of 2 µm;

(2) a glass-oxide-complex (GOC): Mix1 or a binary mixture of Li-GOC1 and Si—Te-GOC1;

(3) an organic carrier;

(3a) a binder: ethyl cellulose (Dow Chemical Co., Ltd., STD4);

(3b) a solvent: terpineol (Nippon Terpine Co., Ltd.); and (3c) a thixotropic agent: DISPARLON 6500 disparlon (Kusumoto Chemicals, Ltd.).

1 wt % of the ethyl cellulose and 1 wt % of the thixotropic agent were fully dissolved in 6 wt % of the terpineol at 50° C. and 90 wt % of the Ag powder and 2.5 wt % of the GOC were added to be mixed uniformly, and an obtained mixture passed through a three-roll mixer to be mixed and dispersed to obtain metallization silver paste P0-1 and P1-P4.

80 mg of each metallization silver paste and 600 mg of an aluminum paste were printed on front and back sides of a silicon wafer with the square resistance of 110-150 Ohm/sq in a predetermined pattern by screen printing and dried in an infrared drying oven. The silicon wafer was rapidly sintered in a rapid sintering furnace at 900° C. for 30 min and cooled to room temperature, and thus a solar cell was prepared.

The structure of the obtained solar cell was shown in the FIGURE. The metallic silver paste was sintered to become a front electrode and the aluminum paste was sintered to form back partial contact; and the structure of the pure silicon wafer included: front $SiN_x$-silicon wafer-$Al_2O_3$-back $SiN_x$.

The series resistance (Rs), the open circuit voltage (Voc), the fill factor (FF) and the photoelectric conversion efficiency (Eff., %) of the solar cell were measured with a solar cell IV tester (HALM). Results were shown in Tables 2-3. It could be seen that the metallic paste with the separated GOC could significantly improve the photoelectric conversion efficiency.

TABLE 2

Formula of conductive paste and electrical test results of cell piece

| 150 Ohm/sq | P0-1 | P1 | P2 | P3 | P4 |
|---|---|---|---|---|---|
| Mix1 (wt %) | 2.5 | / | / | / | / |
| Li-GOC1 (wt %) | / | 0.3 | 0.6 | 1 | 1.25 |
| Si—Te-GOC1 (wt %) | / | 2.2 | 1.9 | 1.5 | 1.25 |
| Series resistance (Rs) | 1.22 | 1.43 | 1.23 | 1.15 | 1.2 |
| Open circuit voltage (Voc) | 688 | 689.2 | 689 | 688.9 | 688.5 |
| Fill factor (FF) | 81.22 | 79.8 | 81 | 81.5 | 81.4 |
| Photoelectric conversion efficiency (Eff.) | 22.84 | 22.14 | 22.78 | 23.1 | 22.95 |

TABLE 3

Formula of conductive paste and relative electrical test results of cell piece

| 150 Ohm/sq | P0-1 | P1 | P2 | P3 | P4 |
|---|---|---|---|---|---|
| Mix1 (wt %) | 2.5 | / | / | / | / |
| Li-GOC1 (wt %) | / | 0.3 | 0.6 | 1.0 | 1.25 |
| Si—Te-GOC1 (wt %) | / | 2.2 | 1.9 | 1.5 | 1.25 |
| Series resistance (Rs) | 100% | 117% | 101% | 94% | 98% |
| Open circuit voltage (Voc) | 100% | 100% | 100% | 100% | 100% |
| Fill factor (FF) | 100% | 98% | 100% | 100% | 100% |
| Photoelectric conversion efficiency (Eff.) | 100% | 96.94% | 99.74% | 101.14% | 100.48% |

The photoelectric conversion efficiency of the current crystalline silicon solar cell PERC-SE is about 23%. This is achieved after more than ten years of an absolute efficiency increase of 0.1-0.2% per year. Therefore, increase of the absolute efficiency of the metallic paste by 0.1% is a huge improvement. Based on the photoelectric conversion efficiency of 23%, an increase of 0.1% of the absolute efficiency is an increase of the relative efficiency of 0.43%.

In the solar cell test process, a statistical confidence analysis (p-value analysis) for the electrical test results (the series resistance, the open circuit voltage, the fill factor and the efficiency) was conducted. The obtained test samples and the reference sample had significant differences (p<0.05), thus the differences caused by test errors were excluded.

Example 2

Preparation of Glass-Oxide-Complex System (GOC):

Different Li-GOC2 and Si—Te-GOC2 were prepared with the components described in Table 4 and a single component Mix2 without separation was also prepared as a control. Samples were prepared in 200 g batches by mixing the oxide components in the mass fraction specified in Table 4. An oxide mixture was loaded into a platinum crucible with a volume of 0.5 L and the crucible was placed into a glass smelting furnace at 1300° C. for 30 min to obtain a glass and oxide frit; the frit was taken out and poured into a counter-roll cooler for quenching to obtain glass slags, and after the glass slags were ground in a 1 L planetary ball mill, the ground glass slags passed through a 325-mesh sieve to obtain GOC powder and Mix2 powder respectively.

TABLE 4

Formulas of Li-GOC2, Si—Te-GOC2 and Mix2

| | | Mix2 | Li-GOC2 | Si—Te-GOC2 |
|---|---|---|---|---|
| Li-GOC | $Li_2O$ | 8.6% | 8.6% | / |
| | PbO | 26.9% | 26.9% | / |
| | $Bi_2O_3$ | / | 5.4% | / |
| | ZnO | / | / | / |
| | $B_2O_3$ | / | 1.1% | / |
| Si—Te-GOC | $SiO_2$ | 8.6% | 8.6% | / |
| | $TeO_2$ | 43.0% | | 43.0% |
| | $Bi_2O_3$ | 10.8% | | 5.4% |
| | $B_2O_3$ | 1.6% | | 0.5% |
| | $Na_2O$ | 0.5% | | 0.5% |

Preparation of Conductive Paste:

A list of components used in the following examples and comparative examples is as follows:

(1) conductive powder: spherical silver powder (AG-4-8, Dowa HighTech Co., Ltd.) with an average particle diameter (D50) of 2 μm;

(2) a glass-oxide-complex (GOC): Mix1, Mix2, LiGOC1, LiGOC2, SiTeGOC1 and SiTeGOC2;

(3) an organic carrier;

(3a) a binder: ethyl cellulose (Dow Chemical Co., Ltd., STD4);

(3b) a solvent: terpineol (Nippon Terpine Co., Ltd.); and (3c) a thixotropic agent: DISPARLON 6500 disparlon (Kusumoto Chemicals, Ltd.).

1 wt % of the ethyl cellulose and 1 wt % of the thixotropic agent were fully dissolved in 6 wt % of the terpineol at 50° C. and 90 wt % of the Ag powder and 3.0 wt % of the GOC were added to be mixed uniformly, and an obtained mixture passed through a three-roll mixer to be mixed and dispersed to obtain metallic silver paste P0-2 and P4-P5.

80 mg of each metallic silver paste and 600 mg of an aluminum paste were printed on front and back sides of a silicon wafer with the square resistance of 110 Ohm/sq in a predetermined pattern by screen printing and dried in an infrared drying oven. The silicon wafer was rapidly sintered in a rapid sintering furnace at 900° C. for 30 min and cooled to room temperature, and thus a solar cell was prepared. The series resistance (Rs), the open circuit voltage (Voc), the fill factor (FF) and the photoelectric conversion efficiency (Eff., %) of the solar cell were measured with a solar cell IV tester (HALM). Results were shown in Tables 5-6. It could be seen that the metallic paste with the separated GOC could significantly improve the photoelectric conversion efficiency.

TABLE 5

Formula of conductive paste and electrical test results of cell piece

| 110 Ohm/sq | P0-2 | P5 | P6 | P7 | P8 |
|---|---|---|---|---|---|
| Mix2 (wt %) | 3.0 | / | / | / | / |
| Li-GOC2 (wt %) | / | 0.3 | 0.6 | 1.0 | 1.5 |
| Si-Te-GOC2 (wt %) | / | 2.7 | 2.4 | 2.0 | 1.5 |
| Series resistance (Rs) | 1.09 | 1.3 | 1.12 | 1.11 | 1.09 |
| Open circuit voltage (Voc) | 683 | 684 | 686.2 | 686 | 685 |
| Fill factor (FF) | 82.11 | 80.04 | 81.9 | 82.4 | 82.32 |
| Photoelectric conversion efficiency (Eff.) | 22.75 | 22.07 | 22.5 | 22.94 | 22.85 |

TABLE 6

Formula of conductive paste and
relative electrical test results of cell piece

| 110 Ohm/sq | P0-2 | P5 | P6 | P7 | P8 |
|---|---|---|---|---|---|
| Mix2 (wt %) | 3.0 | / | / | / | / |
| Li-GOC2 (wt %) | / | 0.3 | 0.6 | 1.0 | 1.5 |
| Si—Te-GOC2 (wt %) | / | 2.7 | 2.4 | 2.0 | 1.5 |
| Series resistance (Rs) | 100% | 119% | 103% | 102% | 100% |
| Open circuit voltage (Voc) | 100% | 100% | 100% | 100% | 100% |
| Fill factor (FF) | 100% | 97% | 100% | 100% | 100% |
| Photoelectric conversion efficiency (Eff.) | 100% | 97.01% | 98.90% | 100.84% | 100.44% |

Comparative Example 1

Preparation of Glass-Oxide-Complex System (GOC):

Different Na-GOC and Si—Te-GOC1 were prepared with the components described in Table 7 and a single component Mix3 without separation was also prepared as a control. Samples were prepared in 200 g batches by mixing the oxide components in the amounts specified in Table 7. An oxide mixture was loaded into a platinum crucible with a volume of 0.5 L and the crucible was placed into a glass smelting furnace at 1300° C. for 30 min to obtain a glass and oxide frit; the frit was taken out and poured into a counter-roll cooler for quenching to obtain glass slags, and after the glass slags were ground in a 1 L planetary ball mill, the ground glass slags passed through a 325-mesh sieve to obtain GOC powder and Mix3 powder.

Preparation of conductive paste and cell piece: formulas and manufacture of pastes P0-3 and P9-P12 were implemented according to the process in Example 1.

TABLE 7

Formulas of Na-GOC, Si—Te-GOC1 and Mix3

| | | Mix3 | Na-GOC | Si—Te-GOC1 |
|---|---|---|---|---|
| Na-GOC | $Li_2O$ | 9.1% | 9.1% | / |
| | PbO | 27.3% | 27.3% | / |
| | $Bi_2O_3$ | 0.0% | 7.3% | / |
| | ZnO | 2.7% | 2.7% | / |
| | $B_2O_3$ | / | 0.45% | / |
| Si—Te-GOC | $SiO_2$ | 9.1% | / | 9.1% |
| | $TeO_2$ | 40.9% | / | 40.9% |
| | $Bi_2O_3$ | 9.1% | / | 1.8% |
| | $B_2O_3$ | 0.9% | / | 0.45% |
| | $Na_2O$ | 0.9% | / | 0.9% |

TABLE 8

Formula of conductive paste and electrical test results of cell piece

| 110 Ohm/sq | P0-3 | P9 | P10 | P11 | P12 |
|---|---|---|---|---|---|
| Mix3 (wt %) | 3.0 | / | / | / | / |
| Na-GOC (wt %) | / | 0.3 | 0.6 | 1.0 | 1.5 |
| Si-Te-GOC1 (wt %) | / | 2.7 | 2.4 | 2.0 | 1.5 |
| Series resistance (Rs) | 1.85 | 3 | 2.9 | 2.5 | 2.2 |
| Open circuit voltage (Voc) | 674 | 654 | 660 | 655 | 658 |
| Fill factor (FF) | 78.3 | 76.2 | 77.2 | 77 | 77.2 |
| Photoelectric conversion efficiency (Eff.) | 21.2 | 19.8 | 20.3 | 20.2 | 20.5 |

TABLE 9

Formula of conductive paste and
relative electrical test results of cell piece

| 110 Ohm/sq | P0-3 | P9 | P10 | P11 | P12 |
|---|---|---|---|---|---|
| Mix3 (wt %) | 3.0 | / | / | / | / |
| Na-GOC (wt %) | / | 0.3 | 0.6 | 1.0 | 1.5 |
| Si—Te-GOC1 (wt %) | / | 2.7 | 2.4 | 2.0 | 1.5 |
| Series resistance (Rs) | 100% | 162% | 157% | 135% | 119% |
| Open circuit voltage (Voc) | 100% | 97% | 98% | 97% | 98% |
| Fill factor (FF) | 100% | 97% | 99% | 98% | 99% |
| Photoelectric conversion efficiency (Eff.) | 100% | 93.40% | 95.75% | 95.28% | 96.70% |

It could be seen from the results of Comparative example 1 that the photoelectric conversion efficiency of the pastes manufactured from separated Na-GOC and Si—Te-GOC was not improved.

Comparative Example 2

Preparation of Glass-Oxide-Complex System (GOC):

Different Li-GOC2 and Bi—Te-GOC were prepared with the components described in Table 10 and a single component Mix4 without separation was also prepared as a control. Samples were prepared in 200 g batches by mixing the oxide components in the amounts specified in Table 10. An oxide mixture was loaded into a platinum crucible with a volume of 0.5 L and the crucible was placed into a glass smelting furnace at 1300° C. for 30 min to obtain a glass and oxide frit; the frit was taken out and poured into a counter-roll cooler for quenching to obtain glass slags, and after the glass slags were ground in a 1 L planetary ball mill, the ground glass slags passed through a 325-mesh sieve to obtain GOC powder and Mix4 powder.

Preparation of conductive paste and cell piece: formulas and manufacture of pastes P0-4 and P13-P16 were implemented according to the process in Example 2.

TABLE 10

Formulas of Li-GOC2, Bi—Te-GOC2 and Mix4

|  |  | Mix4 | Li-GOC2 | Bi—Te-GOC |
|---|---|---|---|---|
| Li-GOC | $Li_2O$ | 8.6% | 8.6% | / |
|  | PbO | 26.9% | 26.9% | / |
|  | $Bi_2O_3$ |  | 5.4% | / |
|  | ZnO |  |  | / |
|  | $B_2O_3$ |  | 1.1% | / |
| Bi—Te-GOC | $SiO_2$ | 1.1% | / | 1.1% |
|  | $TeO_2$ | 43.0% | / | 43.0% |
|  | $Bi_2O_3$ | 18.3% | / | 12.9% |
|  | $B_2O_3$ | 1.6% | / | 0.5% |
|  | $Na_2O$ | 0.5% | / | 0.5% |

TABLE 11

Formula of conductive paste and electrical test results of cell piece

| 110 Ohm/sq | P0-4 | P13 | P14 | P15 | P16 |
|---|---|---|---|---|---|
| Mix4 (wt %) | 3.0 | / | / | / | / |
| Li-GOC2 (wt %) | / | 0.3 | 0.6 | 1.0 | 1.5 |
| Bi—Te-GOC (wt %) | / | 2.7 | 2.4 | 2.0 | 1.5 |
| Series resistance (Rs) | 1.54 | 3 | 2.7 | 2.1 | 1.85 |
| Open circuit voltage (Voc) | 650 | 654 | 652 | 648 | 652 |
| Fill factor (FF) | 77.8 | 74.1 | 76.5 | 77.2 | 77.8 |
| Photoelectric conversion efficiency (Eff.) | 21.4 | 18.3 | 19.2 | 19.7 | 20.4 |

TABLE 12

Formula of conductive paste and relative electrical test results of cell piece

| 110 Ohm/sq | P0-4 | P13 | P14 | P15 | P16 |
|---|---|---|---|---|---|
| Mix4 (wt %) | 3.0 | / | / | / | / |
| Li-GOC2 (wt %) | / | 0.3 | 0.6 | 1.0 | 1.5 |
| Bi-Te-GOC (wt %) | / | 2.7 | 2.4 | 2.0 | 1.5 |
| Series resistance (Rs) | 100% | 195% | 175% | 136% | 120% |
| Open circuit voltage (Voc) | 100% | 101% | 100% | 100% | 100% |
| Fill factor (FF) | 100% | 95% | 98% | 99% | 100% |
| Photoelectric conversion efficiency (Eff.) | 100% | 85.51% | 89.72% | 92.06% | 95.33% |

It could be seen from the results of Comparative example 2 that the photoelectric conversion efficiency of the pastes manufactured from separated Li-GOC and Bi—Te-GOC was not improved.

Although the present disclosure has been disclosed with preferred examples, these examples shall not be construed as limiting the present disclosure. Any person skilled in the art can make various changes and modifications without departing from the spirit and scope of the present disclosure. The protection scope of the present disclosure shall be defined by the following claims.

What is claimed is:

1. A lithium and tellurium-silicate binary glass-oxide-complex system for a solar cell conductive paste, prepared by mixing a lithium-containing glass-oxide-complex (Li-GOC) and a tellurium-silica-containing glass-oxide-complex (Si—Te-GOC);
   wherein, the Li-GOC is obtained by mixing and fusing $Li_2O$, $Bi_2O_3$, PbO, ZnO and $B_2O_3$ to form a glass and oxide frit, and then performing quenching and grinding;
   the Si—Te-GOC is obtained by mixing and fusing $SiO_2$, $TeO_2$, $Bi_2O_3$, $B_2O_3$ and $Na_2O$ to form a glass and oxide frit, and then performing quenching and grinding;
   wherein the lithium and tellurium-silicate binary glass-oxide-complex system comprises a mixture of the Li-GOC and the Si—Te-GOC;
   wherein the Li-GOC comprises, by mass percentage of the Li-GOC, 15%-20% of $Li_2O$, 25%-65% of PbO, 10%-20% of $Bi_2O_3$, 0-6% of ZnO and 0.5%-3% of $B_2O_3$, and the Li-GOC does not contain tellurium; and
   wherein the Si—Te-GOC comprises, by mass percentage of the Si—Te-GOC, 10%-20% of $SiO_2$, 70%-80% of $TeO_2$, 2%-10% of $Bi_2O_3$, 0.5%-1.0% of $B_2O_3$ and 0.5%-2% of $Na_2O$, and the Si—Te-GOC does not contain lithium.

2. The lithium and tellurium-silicate binary glass-oxide-complex system according to claim 1, wherein a mass ratio of the Li-GOC to the Si—Te-GOC is 1:1 to 1:9.

3. A solar cell conductive paste comprising the lithium and tellurium-silicate binary glass-oxide-complex system of claim 1, a conductive metal component, and an organic carrier.

4. The solar cell conductive paste according to claim 3, wherein the conductive metal component comprises silver, gold, platinum, palladium, copper, nickel or any combinations thereof.

5. The solar cell conductive paste according to claim 3, wherein the conductive metal component accounts for 80%-99% by weight of the paste.

6. The solar cell conductive paste according to claim 3, wherein the lithium and tellurium-silicate binary glass-oxide-complex system accounts for 0.2%-5% by weight of the paste.

7. The solar cell conductive paste according to claim 3, wherein the organic carrier accounts for 2%-10% by weight of the entire conductive paste.

8. The solar cell conductive paste according to claim 3, wherein the organic carrier comprises an organic solvent and, and a component selected from a group consisting of a binder, a surfactant, a thixotropic agent and any combinations thereof.

9. The solar cell conductive paste according to claim 8, wherein the organic solvent is selected from a group consisting of carbitol, terpineol, hexyl carbitol, 2,2,4-trimethyl-1,3-pentanediol monoisobutyrate, butyl carbitol, butyl carbitol acetate, and any combination thereof.

10. The solar cell conductive paste according to claim 8, wherein the binder is selected from a group consisting of ethyl cellulose, phenolic resin, polyacrylic acid, polyvinyl butyral, polyester resin, polycarbonate, polyethylene resin, polyurethane resin, a rosin derivative, and any combination thereof.

11. The solar cell conductive paste according to claim 8, wherein the surfactant is selected from a group consisting of polyoxyethylene, polyethylene glycol, benzotriazole, lauric acid, oleic acid, capric acid, myristic acid, linoleic acid, stearic acid, palmitic acid, stearate, palmitate, and any combination thereof.

12. A solar cell containing the solar cell conductive paste of claim 3 on a surface.

13. The solar cell according to claim 12, wherein the solar cell conductive paste and an aluminum paste are respectively on front and back sides of a silicon wafer in a predetermined pattern.

* * * * *

UNITED STATES PATENT AND TRADEMARK OFFICE
CERTIFICATE OF CORRECTION

| | | |
|---|---|---|
| PATENT NO. | : 11,802,075 B2 | Page 1 of 1 |
| APPLICATION NO. | : 17/585682 | |
| DATED | : October 31, 2023 | |
| INVENTOR(S) | : Yan et al. | |

It is certified that error appears in the above-identified patent and that said Letters Patent is hereby corrected as shown below:

On the Title Page

Item (12) should read:
Yan et al.

Item (72) should read:
Inventors: Li YAN, Wuxi (CN); Rui TIAN, Wuxi (CN); Song XU, Wuxi (CN)

Signed and Sealed this
Fifth Day of August, 2025

Coke Morgan Stewart
*Acting Director of the United States Patent and Trademark Office*